United States Patent [19]
Schmitt et al.

[11] 3,935,437
[45] Jan. 27, 1976

[54] SIGNAL PROCESSOR

[75] Inventors: Joseph W. Schmitt, Hudson; Donald L. Starkey, Amherst, both of N.H.

[73] Assignee: Sanders Associates, Inc., Nashua, N.H.

[22] Filed: Feb. 25, 1974

[21] Appl. No.: 445,745

[52] U.S. Cl. ............... 235/152; 324/77 B; 328/167
[51] Int. Cl.² ..................... G06F 7/38; G01R 23/16
[58] Field of Search ............ 235/152; 328/165, 167; 324/77 D, 77 B, .5 A

[56] References Cited
UNITED STATES PATENTS

| | | | |
|---|---|---|---|
| 3,737,636 | 6/1973 | Esteban | 235/152 |
| 3,740,537 | 6/1973 | Giles et al. | 235/152 |
| 3,742,197 | 6/1973 | Pommerening | 235/152 |
| 3,786,351 | 1/1974 | Priebe, Jr. | 324/77 B |
| 3,803,390 | 4/1974 | Schaepman | 235/152 |
| 3,821,482 | 6/1974 | Hirsch | 324/77 B |
| 3,829,670 | 8/1974 | Kebabian | 328/167 |
| 3,833,797 | 9/1974 | Grobman et al. | 235/152 |
| 3,879,661 | 4/1975 | Collins | 324/77 B |

Primary Examiner—Malcolm A. Morrison
Assistant Examiner—Errol A. Krass
Attorney, Agent, or Firm—Louis Etlinger; Robert K. Tendler

[57] ABSTRACT

A signal processor enables the examination of the spectral content of an input signal within a selected analysis bandwidth $f_a$ about an adjustable reference frequency $f_r$. A multi-segment digital filter in the processor provides sharply reduced levels outside the selected analysis bandwidth by first multiplying the effective data rate in a multiple-register integrating filter and then restoring the data rate in subsequent digital filters.

16 Claims, 6 Drawing Figures

$T = \frac{1}{BW}$ $Y_1 = C_0 X_9 + C_1(X_8+X_{10}) + C_3(X_6+X_{12}) + C_5(X_4+X_{14}) + C_7(X_2+X_{16}) + C_9(X_0+X_{18})$ $C_0 = .5000$
$C_1 = .3125$
$C_3 = .0938$
$C_5 = .0488$
$C_7 = .0234$
$C_9 = .0117$

SIGNAL PROCESSOR

BACKGROUND OF THE INVENTION

A. Field of the Invention

The invention relates to signal processing and, more particularly, to digital processing of analog signals. The invention is especially useful in connection with frequency spectrum analyzers.

B. Prior Art

Signal processors in general transform an input signal of one kind into an output signal of another kind. In the past this processing had been done most generally in the analog domain, but in recent years has been increasingly performed in the digital domain. Because of the high speeds of such processing where frequency-translation operations are to be performed on the input data, it is necessary to filter the modulation products to extract only the desired side bands for subsequent processing. When only a narrow portion of the input band of the input data signal is to be analyzed, very narrow band filters are required and the filter design problem for either type of processing for (analog or digital) becomes severe.

BRIEF DESCRIPTION OF THE INVENTION

A. Objects of the Invention

Accordingly, it is an object of the invention to provide an improved signal processor.

Further, it is an object of the invention to provide a signal processor capable of examining a selected narrow band portion of an input signal applied thereto.

Further, it is an object of the invention to provide a signal processor capable of examining a narrow band portion of selected bandwidth of the input signal centered around a selectable reference frequency.

Still a further object of the invention is to provide an improved digital filter for a signal processor.

BRIEF SUMMARY OF THE INVENTION

In accordance with the invention, an analog input signal is sampled at a sampling frequency $f_s$ and digitized and then digitally modulated by a sampled reference frequency signal. This reference signal, whose frequency is selectable within a specified range, is preferably weighted prior to modulation by a cosine-squared weighting function having the frequency $f_a$. The weighting function assists in subsequent filtering of the modulation products by minimizing spectral components at the extreme edges of the band centering on the reference frequency. The resultant weighted, modulated input data is applied to a multi-segment digital filter comprising an integrating filter followed by one or more digital equiband filters. The combination of weighting with the cascaded integrating and equiband filters provides a flat response within the passband together with sharp cutoff outside the passband and good rejection of out of band components.

In contrast with conventional integrating filters, the integrating filter in the present processor utilizes a number of parallel accumulators to which the modulated data is applied. For each input data point, a number of weighting factors are generated. The weighting factors are equally spaced in phase. Thus, if four integrating accumulators are used, four samples of the $\cos^2$ function are generated in time sequence (i.e., they are multiplexed) and are spaced 90° apart at the weighting frequency $f_a$. These weighting factors are multiplied in sequency by each input data point $P_n$ and the products are applied to the respective integrating filter accumulators. The first product $P_n \cos k\, 2\pi f_r/f_s \cos^2 k2\pi f_a/f_s$, ($k = 0, 1, 2, --$) is applied to the first accumulator, the second product $P_n \cos k\, 2\pi f_r/f_s \cos^2 (k2\pi f_a/f_s - \pi/2)$ is applied to the second accumulator, etc. The next data point $P_{n+1}$ is applied to the $\cos^2$ weighting generator to generate four more time multiplex weighted products and these are again distributed among the accumulators as before. Thus, the first accumulator contains the sum of the products of each data point and a weighting factor of a given phase, the second accumulator register contains the sum of the products of each data point and the weighting factor of that phase shifted by −90°, the third register contains the sum of the products of each data point and a weighting factor of that phase shifted by −180°, and the last register contains the sum of the products of each data point and a weighting factor of that phase shifted by −270°.

The accumulator registers are then read out in interleaved sequency. Each register accumulates its sum for a period $T_i = 1/f_a$. These sums are read out at times separated by $T_i/4$; this multiplies the number of data points processed by a factor of four. The output of the integrating filter is then applied to two cascaded equiband filters, each of which effectively reduces the number of data points processed by a factor of two, to thereby restore the original number of data points. However, because an apparently larger number of data points has been applied to them by the integrating filter, the overall filter cutoff is substantially sharpened.

DETAILED DESCRIPTION OF THE INVENTION

The foregoing and other and further objects and features of the invention will be more readily understood from the following detailed description of the invention when taken in conjunction with the accompanying drawings, in which.

Figure 1:
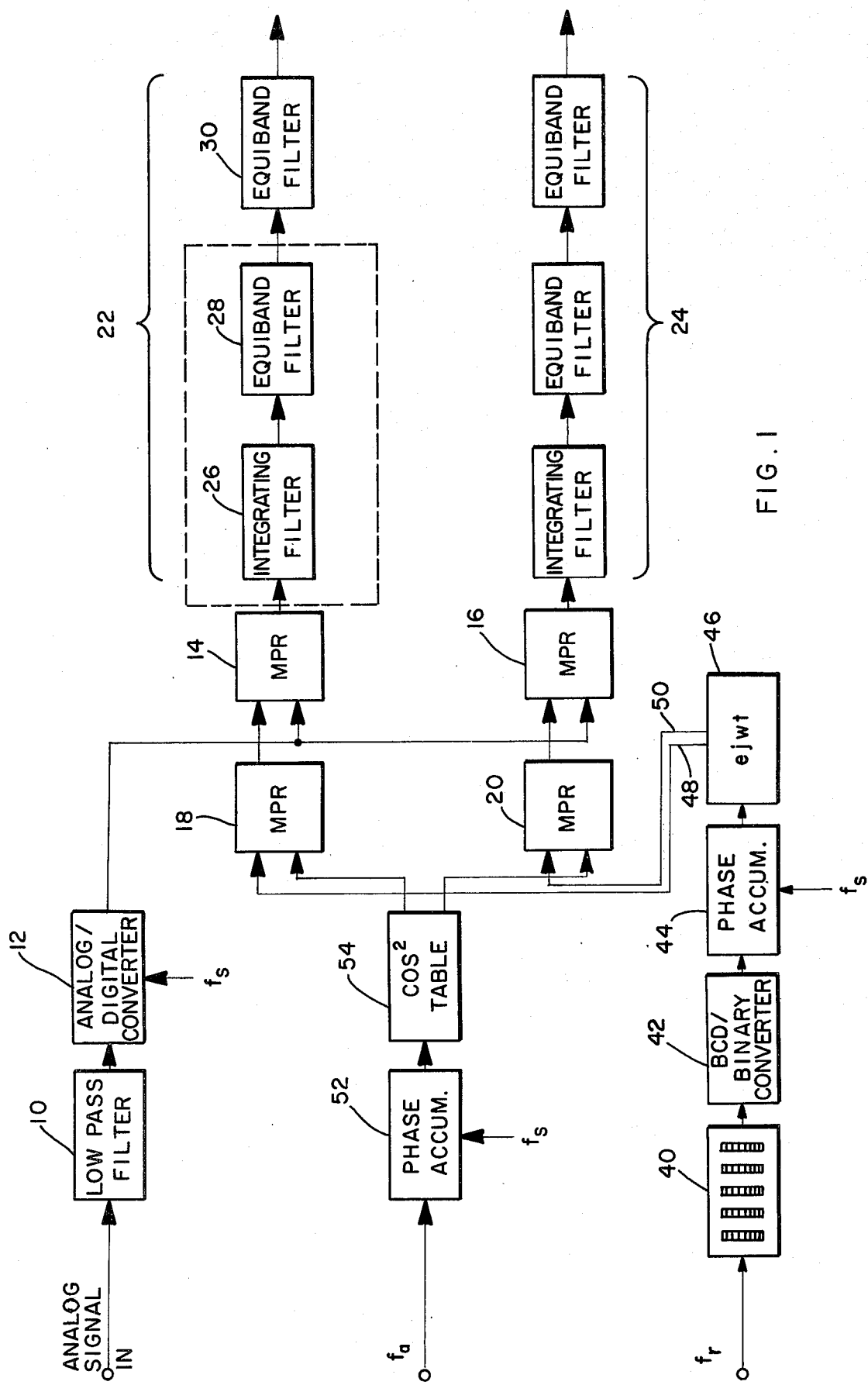
FIG. 1 is a block and line diagram of the data filter of the present invention.

The analog signal to be processed is applied to a low pass analog filter 10 which limits the bandwidth of the input signal and prevents spurious signals arising from "aliasing" when the signal is later sampled. The output of the filter 10 is applied to an analog-to-digital converter 12 which samples the filtered signal at a sampling rate $f_s$. The output of the converter 12 is applied to first and second multipliers 14 and 16, respectively, where it is modulated by a reference signal at a frequency $f_r$ from multipliers 18 and 20. The multipliers 18 and 20 provide a weighted reference frequency signal in the form of A $\sin\omega_r t$ and A $\cos\omega_r t$, respectively, where $\omega_r = 2\pi f_r$ is the (angular) reference frequency and A is a weighting factor which assists in improving subsequent filtering. The generation of the weighted reference signal will be described shortly.

The outputs of the multipliers 14 and 16 are applied to digital filters 22 and 24, respectively. The filter 22 is formed from an integrating filter 26 and two digital equiband filters 28 and 30. The filter 24 is similarly constituted and will not be described in further detail. The outputs of the filters 22 and 24 comprise filtered data samples translated in frequency by the selected reference frequency, $f_r$. The processor effectively has two channels, namely, a first channel comprising multipliers 14 and 18 and filter 22 and a second channel comprising multipliers 16, 20 and filter 24. The first channel processes the imaginary component $A \sin \omega_r t \cdot f(t)$ of the modulated data signal $f(t)$ and the second channel processes the real component $A \cos \omega_r t \cdot f(t)$ of the data signal. The processing is the same in each channel.

The reference frequency applied to the multipliers 14 and 16 is derived as follows:

The desired reference frequency is applied to the signal processor by, for example, dialing the frequency into a series of thumbwheel switches in a selector unit 40. These switches conveniently display the desired frequency in decimal digital form. The setting of these switches is converted by a converter 42 which generates a binary digital string representative of the reference frequency $f_r$ dialed into the unit 40. This digital string is applied to a phase accumulator (counter) 44 which steps through counts corresponding to 360° at a rate $f_s$, in increments corresponding to phase increments of magnitude $f_r/f_s \times 360°$. Thus as the accumulator 44 cycles from the count of O to T, its content correspond to a progressive phase angle from 0° to 360°.

The contents of phase accumulator 44 are applied to a read-only memory 46 which has stored in it factors of $e^{j\omega_r t}$, where $\omega_r t$ is the angle generated by phase accumulator 44. The factors $e^{j\omega_r t}$ are stored in memory 46 in the form of sine and cosine values which are applied to the multipliers 18 and 20 over leads 48 and 50, respectively.

Weighting factors for the reference frequency are also applied to the multipliers 18 and 20 from a phase accumulator (counter) 52 and a read-only memory 54. The memory 54 contains values of the weighting function for each different value of the argument supplied to it. In the present case, the weighting function is a $\cos^2$ function. The argument applied to the memory 54 is generated in a phase accumulator 52 comprising a binary counter which cycles through counts corresponding to 360° at a rate of $f_s$ in increments determined by the selected bandwidth $f_a$. For reasons to be described later, the memory 54 supplies four values of the function $\cos^2$ for each argument presented to it; these values differ by factors of 90° and are given as $\cos^2 \alpha$, $\cos^2(\alpha-90°)$, $\cos^2(\alpha-180°)$, $\cos^2(\alpha-270°)$, where $\alpha$ is the argument presented by accumulator 52. In the present case, the increments applied to the accumulator proportional to $f_a/f_s \times 360°$ that is, the bandwidth about the selected reference frequency over which the system output is to extend. This facilitates detailed examination of the spectrum of an applied analog signal. The selected analysis bandwidth not only determines the counting increment for the accumulator 52 but also sets the integration time of the integrating filters as will be described subsequently in more detail.

Figure 2A:
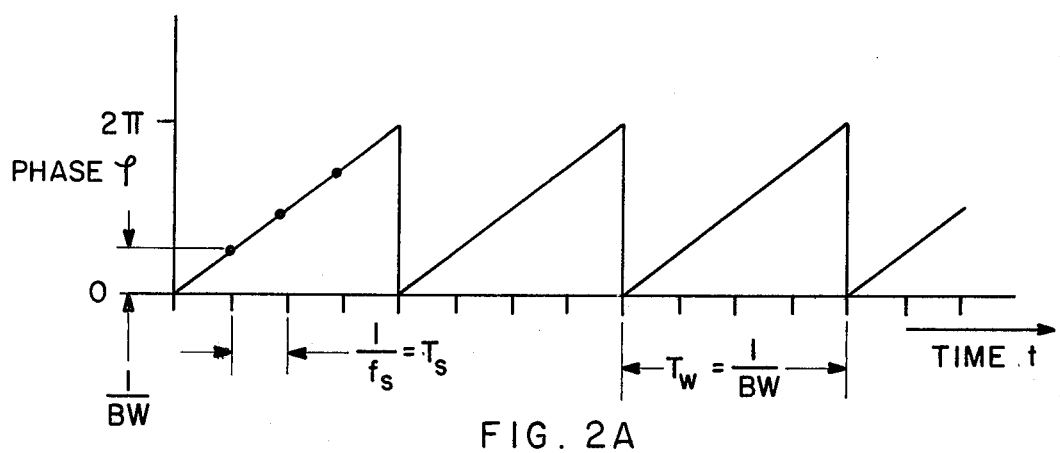
FIG. 2 shows illustrative waveforms of various portions of the apparatus of FIG. 1.

In FIG. 2A the operation of the weighting phase accumulator 42 is represented in more detail. The phase of the accumulator 52 is represented as sawtooth wave which increases linearly from an angle of 0° to 360°. The phase is incremented every $1/f_s$ seconds. The size of the increment, as previously noted, is determined by the analysis bandwidth and, in particular, is given by $BW/f_s \times 360°$, where BW is the analysis bandwidth. The accumulator 52 recycles for operation as a modulo 360° counter. Accordingly, the analysis bandwidth determines the slope of the phase-time curve and thus its period. The period of the curve is seen to be given by 1/BW and, for reasons shortly to be explained, this is also the integration time of the integrating filters.

In order to sharpen the filtering, each integrating filter comprises a group of four separate integrate-and-dump filters. These are implemented by means of accumulators which add the digital signals presented thereto over the integration time, dump them on command, and resume adding.

Figure 2B:
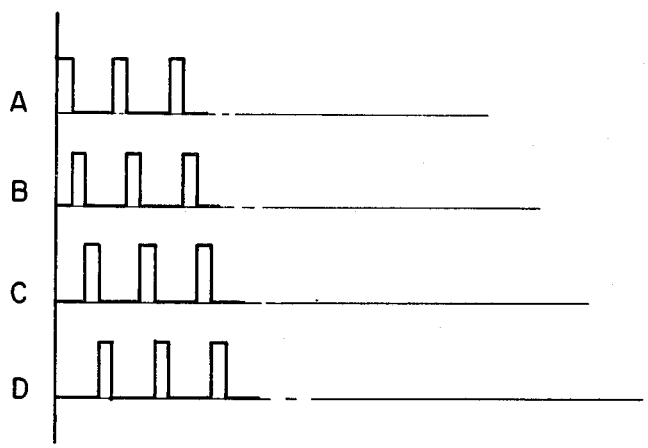
Figure 3:
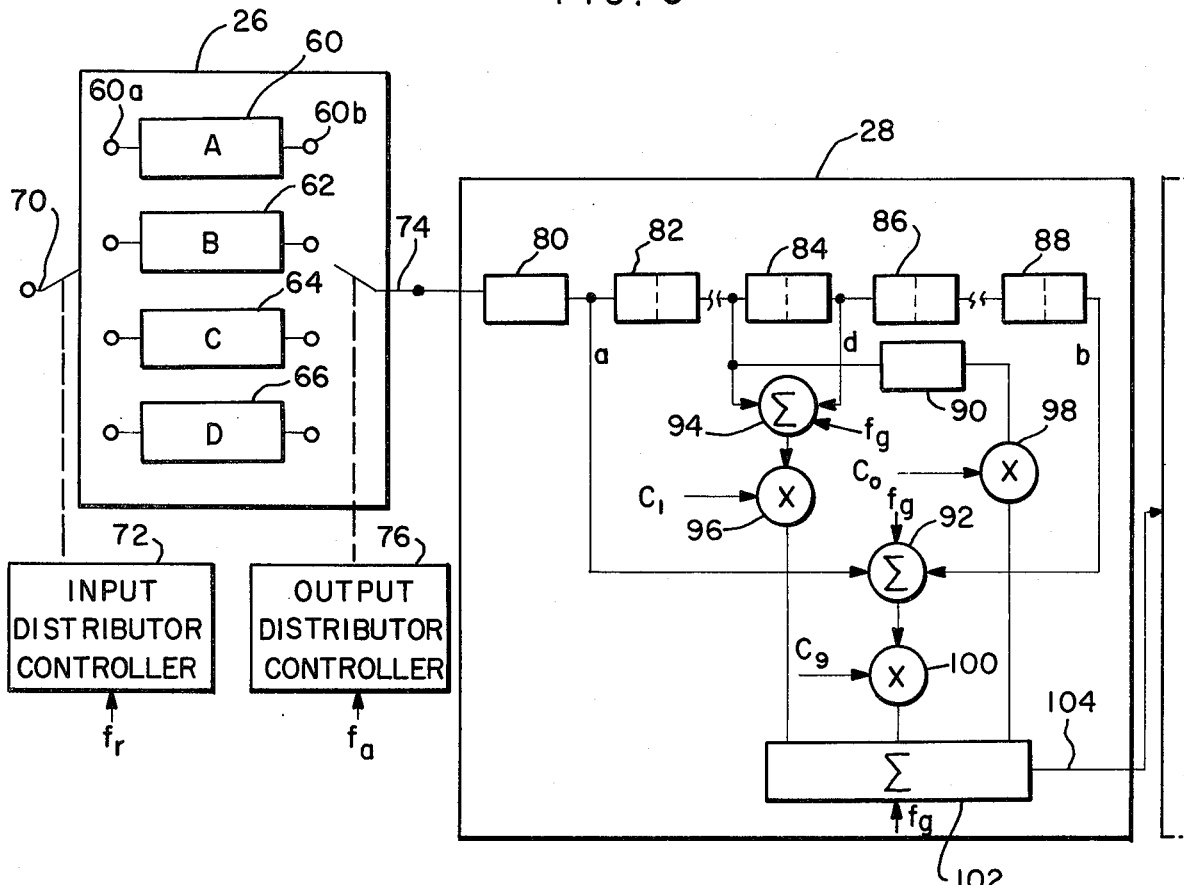
FIG. 3 is a detailed block and line diagram of the integrating filter and equiband filter of FIG. 1.

More specifically, as shown in FIG. 3, filter 26 is formed from four accumulators, 60, 62, 64 and 66, respectively. Each such accumulator has an input terminal such as terminal 60a and an output terminal such as terminal 60b. Data is applied to the input terminal at a first rate and is read from the output terminal at a second rate. This data is distributed to the registers 60 – 66 by means of an input distributor 70 controlled by distributor controller 72 and is received in sequence from the output terminals of the respective accumulators by means of an output distributor 74 controlled by distributor controller 76. The input distributor 70 is controlled by the timing of four-phase outputs from the memory 54. The distributor control signals, as shown in FIG. 2B, are sequential in time and non-overlapping. They occur at four times the sampling rate, i.e. $4f_s$. These signals are very simply generated by means of a four-phase binary counter operating at four times the sampling rate, i.e., $f_s$.

Figure 2C:
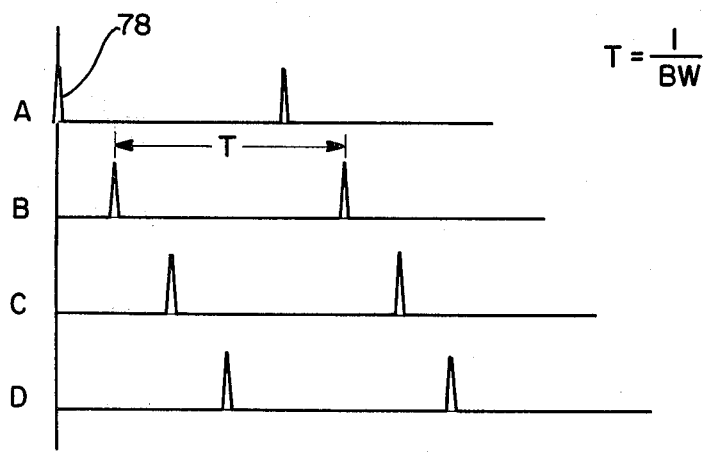

The output distributor 74 is controlled so as to read out the contents of the accumulators 60 – 66 in sequency. Each accumulator is read out at the end of successive integration times given by $T_i = BS$. Further, the read out of each accumulator occurs at a time $T_i/4$ seconds after the readout of the immediately preceding register. After all four accumulators are read out, the distributor 74 recycles to the first register and again proceeds down the chain. The readout signals 78 which accomplish this are shown in FIG. 2C. These signals are generated in controller 76 which comprises a four-phase counter whose counting cycle is set equal to the reciprocal of the analysis bandwidth $f_a$.

The filter 26 effectively multiplies the number of data samples by a factor of 4 and interweaves similar strings of data samples. In order to recover the original number of data samples, it is necessary to divide the multiplied sample string by 4. This is accomplished in the equiband filters 28 and 30 (FIG. 1) and their counterparts in the filter 24. The equiband filter 28 is shown in detail in FIG. 3; the filter 30 is identical to the filter 28 and need not be described in detail.

The filter 28 has an input buffer register 80 followed by a chain of registers 82, 84, 86, 88, each of which stores two data words. The registers 80 – 88 are conventional shift registers. The first register 80 is a buffer register which assembles in sequence the outputs of the accumulators 60 – 66 in filter 26.

In addition, a register 90 stores a single word. The number of registers connected in the chain is dependent on the desired filter response. In the present case, the register length may be considered sufficient to accommodate 19 words (nine two-word registers and one one-word register) and one buffer sufficient to accommodate the sequential readouts from the filter registers 60 – 66.

The contents of the register 80 are passed to the register 82 one bit at a time. The register 82, in turn, shifts its contents one bit at a time and supplies them to the next register in the sequence. An output tap is provided at the end of every register, and these taps are thus located two words apart. The register 90 is connected so that its output is the middle of the sequence. The bits output available at the respective taps are added together in pairs, such that the output of the buffer register 80 is added to the output of the last register 88, the output of the first register 82 is added to the output of the second last register (not shown), and so forth. Thus, if the register sequency 82 – 88 comprises nine two-word registers, with $x_0$ representing the output of the last register and $x_{18}$ representing the word applied to the first register 82, the outputs are added serially as $x_0 + x_{18}$, $x_2 + x_{16}$, $x_4 + x_{14}$, etc. $x_9$ is not summed with another output. These sums are formed in summers 92, 94, etc. and are then multiplied by weighting co-efficients $C_i$ in multipliers 96, 98, 100, etc. The sum of the resultant products is formed in a summer 102 and is then applied by a lead 104 to the following equiband filter.

In order to halve the number of data points which are passed on to the filter 30, the filter 28 sums only every other word in the sequence applied to it by the filter 26. This is accomplished by operating the summers 92, 94, 102, etc. only when every other word appears at the output of the registers 80 – 88.

As noted previously, the filter 30 is identical to the filter 28. Accordingly, it further divides the data rate connected to it by a factor of 2. The effect of this is to recover the original integrate and dump rate of the separate accumulators in the integrating filter prior to the expansion of this data rate in the multipliers 14 and 16 and integrating filters 26.

Figure 4:
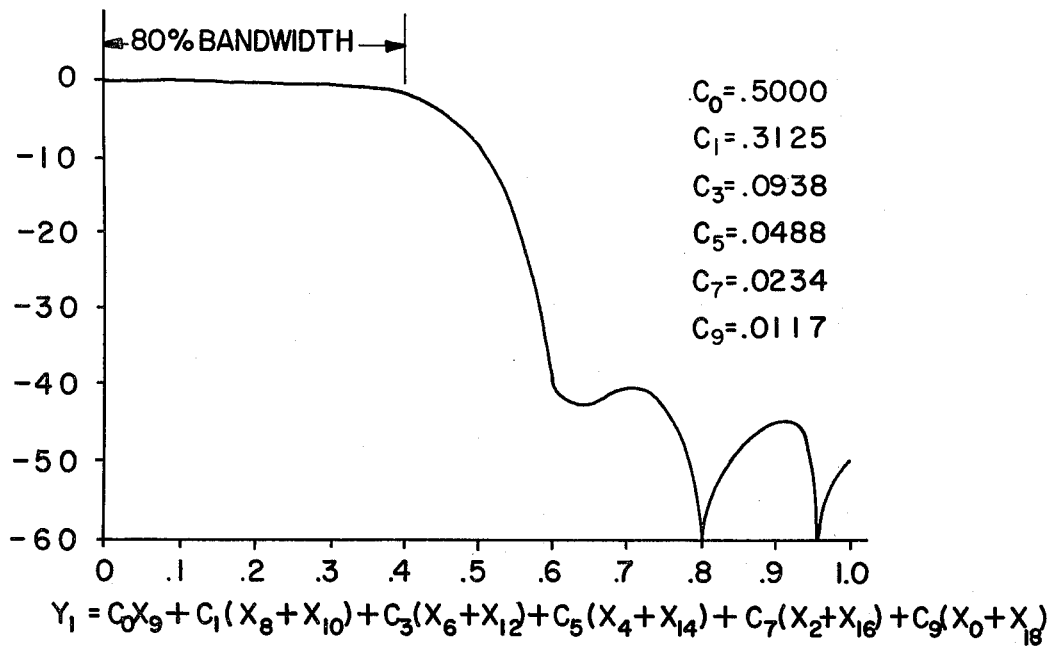
FIG. 4 is a diagram of the frequency response of the filter of the present invention.

A practical signal processor constructed in accordance with the present invention samples signals having frequency components up to 40 kHz at a sampling rate of 163.84 kHz. 1024 data samples are accumulated in each accumulator register of the integrating filters during each integration time. Analysis bandwidths $f_a$ ranging from 8 Hz to 32 KHz are selectable by the operator. This gives spectral resolutions R which ideally range from $R = f_a/1024 \cong .008$Hz to 32Hz. The resolutions are somewhat less than this due to non-ideal filtering and thus range from approximately .01 Hz to approximately 40.0 Hz. The integrating filter in each channel was followed by two cascaded equiband filters using eleven words (five pairs of "even" words and are odd word) implementing the equation shown in FIG. 4 and achieved over 40 dB of in-band spurious rejection of 40 dB of attention of frequencies greater than 1250 R as shown in FIG. 4.

CONCLUSION

From the foregoing it will be seen that I have provided an improved signal processor. The processor enables the examination of the spectral components within an arbitrary band about a selected reference frequency. The components outside the selected analysis band are sharply reduced in amplitude by the use of a multiple-accumulator digital integrating filter which effectively multiplies the sampled data rate. The integrating filter is followed by several equiband digital filters which restore the data rate by effectively dividing the rate of the data presented to them by factors of two. The response of this filter is even further improved by weighting the reference frequency with a $\cos^2$ factor prior to frequency translation of the input data.

Having illustrated and described the preferred embodiment of the invention, I claim:

1. A digital signal processor for isolating different spectral segments of an analog signal applied thereto, said processor comprising
    A. means for providing digital samples of said analog signal,
    B. means for generating a selected reference frequency signal,
    C. means for multiplying said digital samples by said reference frequency signal to thereby translate the spectrum of said analog signal to a band around a predetermined frequency,
    D. filter means including a multi-register digital integrating filter having a selected integration period for accumulating said reference-frequency-multiplied samples in separate registers over said integration period, each multiplied input sample being applied to each register, and
    E. means for reading out the contents of said registers at the end of each integration period at times separated by submultiples of the integration period.

2. A digital signal processor according to claim 1 in which the selected reference frequency signal generating means includes,
    A. means for selecting a desired reference frequency,
    B. an accumulator responsive to said selection means to increment the contents thereof by the selected reference frequency,
    C. means for energizing said accumulator at a first rate and
    D. storage means responsive to the contents of said accumulator to provide an output proportional to $e^j \alpha$, where $\alpha$ is the contents of said accumulator.

3. A digital signal processor according to claim 2 in which said accumulator is energized at a rate corresponding to the rate at which said digital samples are provided.

4. A digital signal processor according to claim 1 which includes weighting means for weighting the selected reference frequency signal prior to translation of the analog signal spectrum, comprising
    A. means generating a linearly varying phase angle at a rate proportional to the reciprocal of the integration time of said integrating filter,
    B. means generating a weighting factor from said angle, and
    C. means multiplying the reference frequency signal by said weighting factor prior to translation of the analog signal spectrum.

5. A digital signal processor according to claim 4 in which the weighting factor generating means comprises a pre-loaded read-only memory having stored therein the $\cos^2$ values of the phase angles generated by said angle generator.

6. A digital signal processor according to claim 1 in which said filter means includes a plurality of equiband filters in cascade and receiving the output of said integrating filter.

7. A digital signal processor according to claim 6 in which the number of equiband filters in cascade equals $\log_2 n$, where $n$ is the number of accumulator registers in said integrating filter.

8. A digital filter for a digital signal processor, said filter comprising
    A. a multi-register digital integrating filter for accumulating data samples supplied thereto in separate registers over a predetermined integration period, B. means for applying successive data samples to successive ones of said registers in sequence, C. an intermediate storage register, D. means for reading out the contents of each of said filter registers into said intermediate storage register in sequence and at intervals spaced apart by submultiples of the integration period of said filter to thereby form an overlapped sequence of accumulated data, and E. digital filter means connected to process only selected segments of the data sequence in said intermediate storage register for recovering therefrom a number of filtered samples proportional in number to the number of samples applied to each of said separate registers.

9. A digital filter according to claim 8 in which said digital filter means includes a plurality of equiband filters in cascade to receive the output of said integrating filter for further filtering of the output of said integrating filter.

10. A digital filter according to claim 9 in which the number of equiband filters is $\log_2 n$, where $n$ is the number of registers in the integrating filter.

11. Apparatus for selecting a predetermined band of frequencies of an incoming signal centered about a selected reference frequency prior to fourier processing comprising means for providing a digital signal corresponding to an analog input signal;

means for shifting the spectra of the frequencies represented by said digital signal down by an amount equal to said reference frequency by complex multiplication of predetermined digital quantities in said digital signal by other complex digital quantities, thereby to produce a complex data signal capable of having both positive and negative frequency components; and means for filtering said data signal to remove spectral components of said data signal outside said predetermined band.

12. The apparatus of claim 7 wherein said filter means includes an integrator and dump means, the integration period determining said bandwith, whereby high frequency signals integrate out at a substantially zero signal level while low frequency signals are passed at a non-zero level.

13. The apparatus of claim 12 wherein said integrator and dump means includes means for increasing the number of data points without increasing said bandwidth.

14. The apparatus of claim 13 wherein said data point increasing means includes means for reading out said multiple integrator means and for reducing the number of data points to the original number by reading out a number of bits less than the total number of bits available, on a periodic basis.

15. The apparatus of claim 14 wherein said readout means includes equiband filter means coupled to the output of said filter means for more highly defining the band defined by said first mentioned filter means.

16. The apparatus of claim 15 wherein said equiband filter means includes a number of shift registers connected in series, means for sequentially coupling the outputs of said multiple integration means to the inputs of said series connected shift registers, means for summing the outputs of selected pairs of registers, and means for multiplying the output of selected summed pairs with selected weighting factors.

* * * * *